United States Patent [19] [11] Patent Number: 5,024,570
Kiriseko et al. [45] Date of Patent: Jun. 18, 1991

[54] CONTINUOUS SEMICONDUCTOR SUBSTRATE PROCESSING SYSTEM

[75] Inventors: Tadashi Kiriseko, Kanagawa; Hiromichi Tani, Kawasaki; Noriko Soma, Yokohama; Nobuhisa Shigemi, Kawasaki; Takayuki Toyoda, Yokkaichi, all of Japan

[73] Assignee: Fujitsu Limited, Kawasaki, Japan

[21] Appl. No.: 403,355

[22] Filed: Sep. 6, 1989

[30] Foreign Application Priority Data

Sep. 14, 1988 [JP] Japan .................................. 63-230578
Jun. 30, 1989 [JP] Japan .................................. 1-168333

[51] Int. Cl.$^5$ ............................................. B65H 85/00
[52] U.S. Cl. .................................... 414/222; 414/273; 414/286; 901/7
[58] Field of Search ............... 414/222, 225, 226, 273, 414/286, 416, 417; 901/6, 7; 198/347, 346.2, 349.6, 349.7

[56] References Cited

U.S. PATENT DOCUMENTS 4,695,215 9/1987 Jacoby et al. ..................... 414/225
4,722,653 2/1988 Williams et al. .................. 414/222
4,764,078 8/1988 Neri ..................................... 901/6 X
4,870,590 9/1989 Kawata et al. ..................... 901/7 X

FOREIGN PATENT DOCUMENTS 0222903 9/1987 Japan ................................... 414/222
2188014 9/1987 United Kingdom ............... 414/222

Primary Examiner—Robert J. Spar
Assistant Examiner—Donald W. Underwood
Attorney, Agent, or Firm—Staas & Halsey

[57] ABSTRACT

A continuous semiconductor substrate processing system is operated by a system control structure in accordance with a predetermined processing program. A wafer conveying mechanism conveys wafers to and from each of plural process stations, each of which performs a corresponding process step on semiconductor wafers, to and from a stocker and to and from an inspection unit. Carriers, movable by manual or mechanical structure other than the wafer conveying mechanism, provide for alternative conveying of wafers to and from each of the process stations, the stocker and the inspection station. The system control structure monitors and selectively controls each of the wafer conveying mechanism, the process stations and the stocker and issues instructions for movement of the carriers and monitors the positioning of carriers for selective control of the transfer of wafers and the priority sequence of processing of wafers, to maintain continuous performance of plural process steps on plural lots of semiconductor wafers.

11 Claims, 20 Drawing Sheets

CONTINUOUS SEMICONDUCTOR SUBSTRATE PROCESSING SYSTEM

BACKGROUND OF THE INVENTION

1. Field of the Invention

This invention relates to a system for producing semiconductor devices and, more particularly, to a system for successively and continuously processing semiconductor substrates (wafers).

Usually, semiconductor devices are produced continuously and consistently by coupling individual process stations or units, which perform respective predetermined processes on semiconductor wafers, to one another by a conveying mechanism for conveying the semiconductor wafers.

In the prior art system, however, the entire processing system for producing semiconductor devices must be stopped when a fault occurs in any of the process stations or units or a part of the conveying mechanism, and if the recovery of the system requires a long time, a great reduction of the productivity and disarrangement of the production schedule occurs.

Therefore, the processing system should be capable of operating even when a part thereof is under maintenance due to a fault occurrence.

2. Description of the Related Art (1) Processing for Producing Semiconductor Devices In the production of a large quantity of a few kinds of products such as DRAM's (dynamic random access memories), a plurality of production process steps can not be carried out at one time in the same semiconductor wafer processing system, and therefore, semiconductor devices can be produced only by processing semiconductor wafers in a proper order and by a fixed procedure.

On the other hand, in the production of a small quantity of many kinds of products such as ASIC (application specific integrated circuits), a plurality of process steps must be carried out simultaneously in a semiconductor wafer processing system to meet a given term.

Currently, a continuous semiconductor wafer processing system having a wide freedom of choice of many different process steps is required, to meet the demand for a small quantity of many different kinds of semiconductor device products, including ASIC.

(2) Example of Prior Art Continuous Processing System

A prior art continuous processing system is disclosed in Japanese Patent Publication 59-31211, corresponding to USP 3946484, and FIG. 1 is a schematic plan view of this disclosed system.

The system comprises independent wafer-processing stations or units 1A to 1F and a central conveying unit 2 for transferring wafers to and from the individual stations or units by a reciprocal operation. A continuous processing of wafers is made possible by coupling the individual process stations or units with the central conveying unit 2.

As an example, a processing procedure for manufacturing FET (field effect transistor) will now be described.

(1) Wafers are supplied from a Loader 3 to an initial oxidization station 1A.

(2) Cleaning of the wafer surface, formation of an initial oxide film, and coating of a photoresist are carried out in the initial oxidization station 1A.

(3) The central conveying unit 2 picks up wafers after the process step (2) and conveys them to a photoresist exposure station 1D.

(4) Exposure by a predetermined pattern is made in the photoresist exposure station 1D.

(5) The central conveying unit 2 picks up wafers after the process step (4) and conveys them to a drain station 1B.

(6) Development of the photoresist, etching of the oxide film, and formation of a drain region by diffusion are carried out in the drain station 1B.

The photoresist is then coated.

(7) The central conveying station 2 picks up wafers after the process step (6) and conveys them again to the photoresist exposure station 1D.

(8) A gate region pattern exposure is carried out in the photoresist exposure station 1D.

(9) The central conveying unit 2 picks up wafers after the process step (8) and conveys them to a gate station 1C.

(10) Development of the photoresist, etching and the formation of an oxide film are carried out in the gate oxidation station 1C.

The photoresist is again coated.

(11) The central conveying unit 2 picks up wafers after the process (10) and conveys them to the photoresist exposure station 1D again.

(12) Exposure to a predetermined pattern is carried out in the photoresist exposure station 1D.

(13) The central conveying unit 2 picks up wafers after process (12) and conveys them to a metallization station 1E.

(14) Development of the photoresist, etching, and a metallization of the wafer surface are carried out in the metallization station 1E.

The photoresist is again coated.

(15) The central conveying unit 2 picks up wafers after the process (14) and conveys them to the photoresist exposure station 1D again.

(16) Exposure by a predetermined pattern is made in the photoresist exposure station 1D.

(17) The central conveying unit 2 picks up wafers after the process step (16) and conveys them to a sintering station 1F.

Development of the photoresist, etching of the metallic film, and sintering of the wafer are carried out in the sintering station 1F.

Thereafter, the wafers are collected in an unloader 104, thus ending the processing of the wafers.

As shown above, a series of processes on the wafers is completed by conveying wafers to individual process stations for processing wafers in a predetermined sequence.

In the above processing system, however, once a fault occurs in any of the process stations IA to 1F or in a part of the central conveying unit 2, the series of wafer processing steps can no longer be continued, that is, the entire processing system must be stopped, thus leading to an extreme reduction of the productivity and a disturbance of the production schedule.

In addition, the processing in this case gives priority to the processing of preceding wafers. This means that the speed of processing (or processing time of) a succeeding wafer is prescribed by the speed of processing a preceding wafer. In other words, the processing efficiency is determined by the processing time of the slowest process station, i.e., the station operating at the lowest processing speed of all the process stations.

Therefore, where a plurality of different kinds of products are produced, the throughput of the processing system is greatly reduced due to the differences in the processing times of the various process steps at the corresponding stations.

SUMMARY OF THE INVENTION

It is an object of the present invention to solve the above problems inherent in the prior art continuous semiconductor wafer processing system, and to realize a processing system which is capable of operating even when a fault occurs in, or during maintenance of, a part thereof, so that fewer processing efficiency variations occur even when producing a plurality of different kinds of products at one time, which affords a wide freedom of choice of process steps and stations, and which has high productivity.

According to the present invention there is provided a continuous semiconductor wafer processing system comprising a plurality of different process stations (5) for performing respective predetermined processes on semiconductor wafers and a semiconductor wafer conveying mechanism (4) coupled to said individual semiconductor wafer process stations (5);

each process station (5) being coupled to said semiconductor wafer conveying mechanism (4) via an interface section (6) including a transfer mechanism (11) for transferring semiconductor wafers between said conveying mechanism (4) and each of said process stations (5), a wafer discrimination section (13) for discriminating said semiconductor wafers, and a buffer section (12) for temporarily storing said semiconductor wafers;

said continuous semiconductor wafer processing system further comprising:

a stocker (7) coupled to said conveying mechanism (4) for temporarily accommodating semiconductor wafers during the processing and including a wafer storage section (15) for storing said semiconductor wafers, a transfer mechanism (14) for transferring semiconductor wafers between said storage section (15) and said conveying mechanism (14), a wafer discrimination section (16) for discriminating said semiconductor wafers, and a carrier feed-in feed-out section (17) capable of feeding in and feeding out said semiconductor wafers; and a conveying mechanism control section (9) for controlling said conveying mechanism (4) and a system control section (10) for communicating with and controlling said process stations (5), interface sections (6), stocker (7) and conveying mechanism control section (9).

PREFERRED EMBODIMENT OF THE INVENTION

Before describing the preferred embodiment, the principle of the present invention will be explained.

Figure 1:
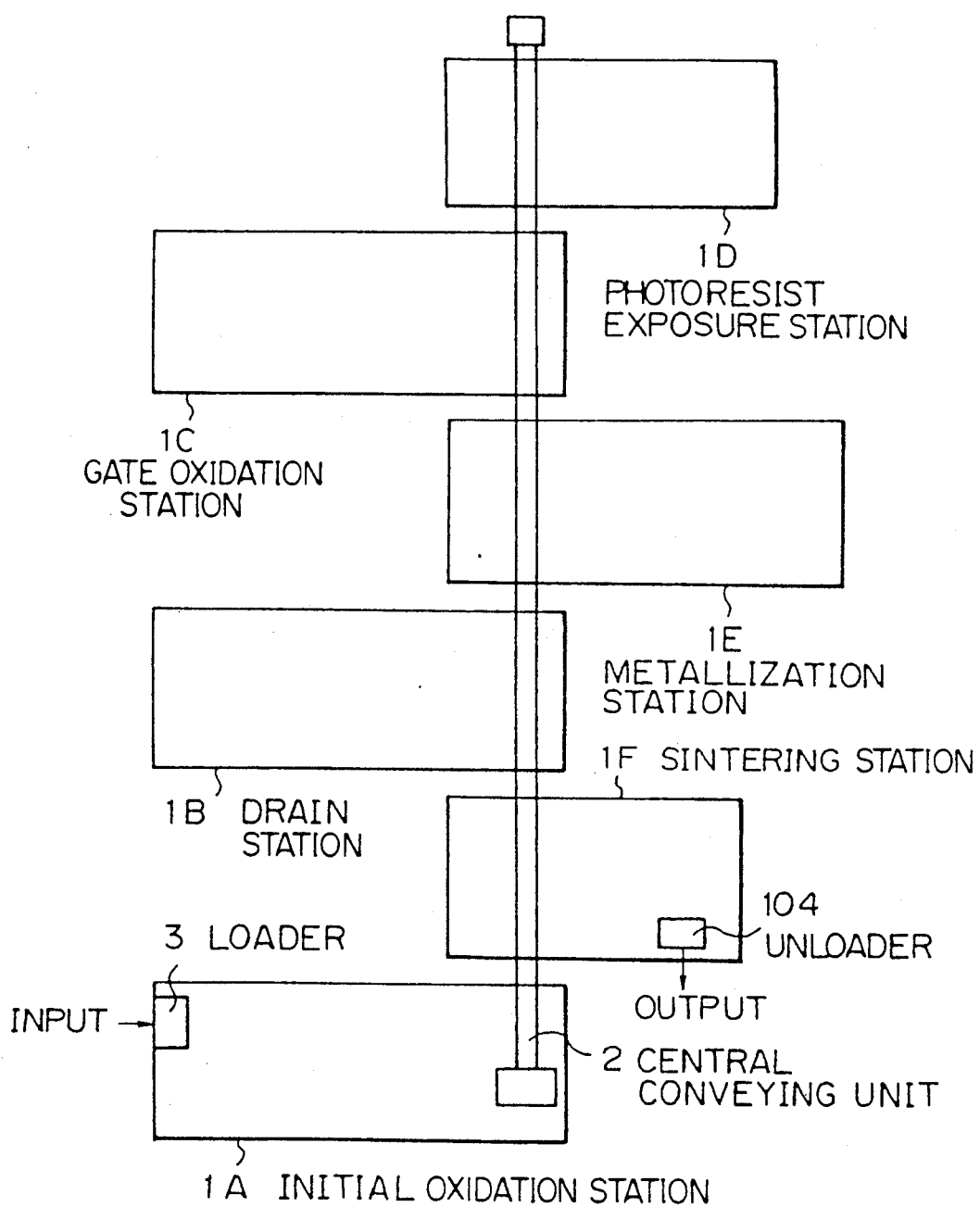
FIG. 1 is a schematic block diagram for explaining a prior art processing system.
Figure 2:
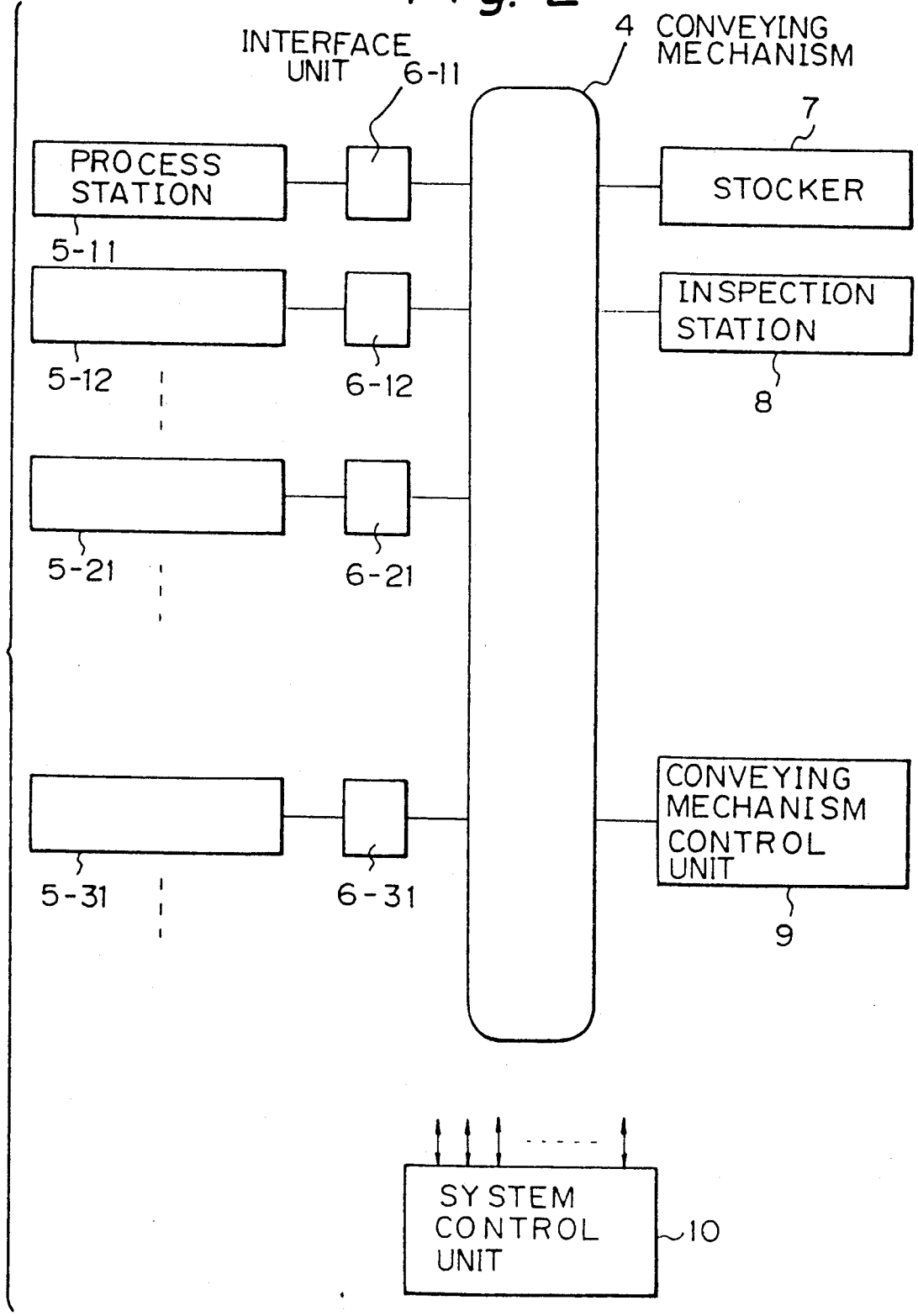
FIG. 2 is a schematic block diagram for explaining the principles underlying the invention.
Figure 3:
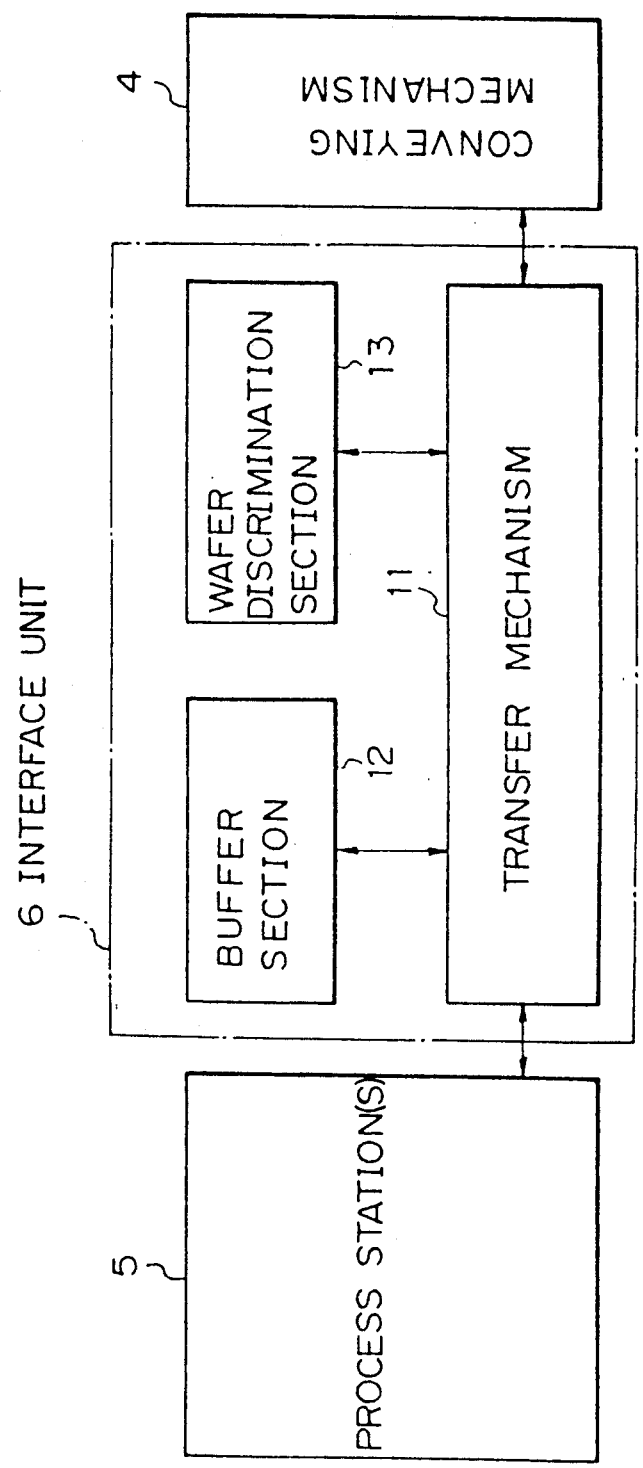
FIG. 3 is a schematic block diagram for explaining the basic construction of an interface section.
Figure 4:
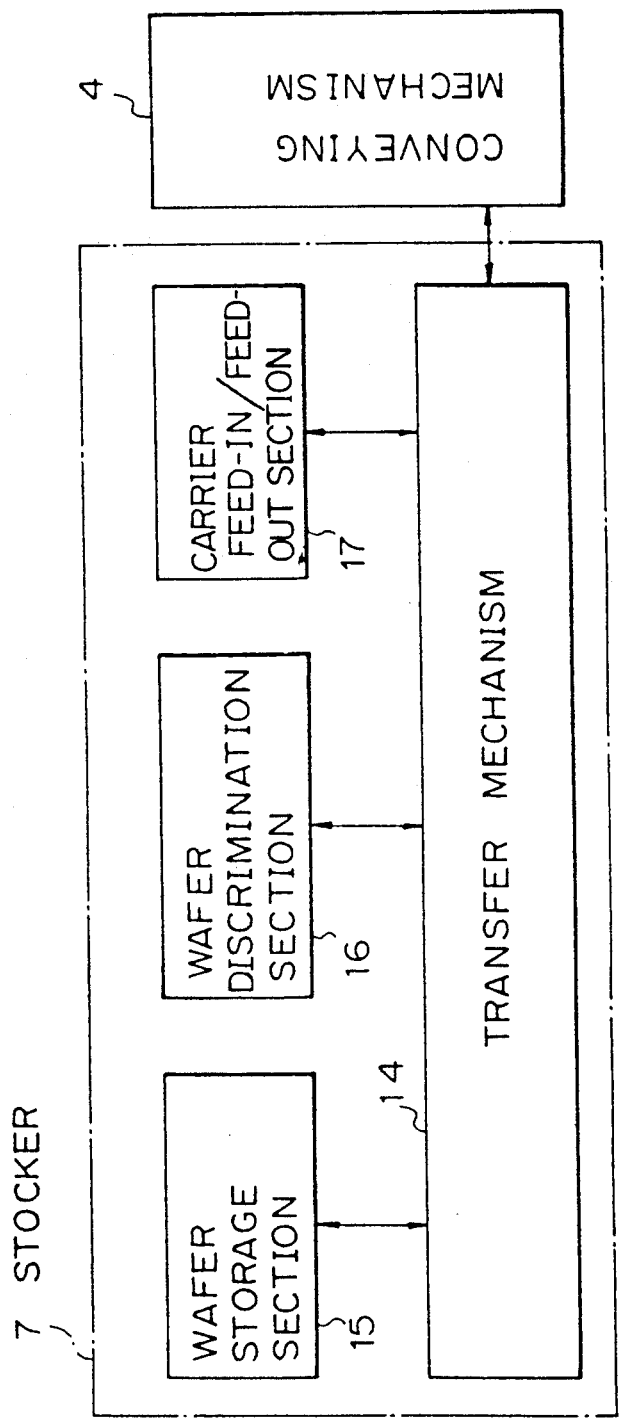
FIG. 4 is a schematic block diagram for explaining the basic construction of a stocker.

FIG. 2 is a block diagram for explaining the principles underlying the invention, FIG. 3 is a block diagram for explaining the basic construction of an interface section, and FIG. 4 is a block diagram for explaining the basic construction of a stocker.

The processing system according to the invention has the features that it can temporarily store wafers, it can set a priority order of the processing of wafers, and that it can convey wafers by a carrier.

(1) Basic Construction

A continuous semiconductor wafer processing system according to the invention comprises a plurality of different process stations 5 for performing respective predetermined processes on semiconductor wafers, and a semiconductor wafer conveying mechanism 4 coupled to the individual semiconductor wafer process stations 5; each process station 5 being coupled to the semiconductor wafer conveying mechanism 4 via an interface section 6 including a transfer mechanism 11 for transferring semiconductor wafers between the conveying mechanism 4 and each process station 5, a wafer discrimination section 13 for discriminating the semiconductor wafers and a buffer section 12 for temporarily storing the semiconductor wafers.

The continuous semiconductor wafer processing system further comprises: a stocker 7 coupled to the conveying mechanism 4 for temporarily accommodating semiconductor wafers during processing, and which includes a wafer storage section 15 for storing the semiconductor wafers, a transfer mechanism 14 for transferring semiconductor wafers between the storage section 15, the transfer mechanism 14, a wafer discriminating section 16 for discriminating the semiconductor wafers, and a carrier feed-in feed-out section 17 capable of feeding in and feeding out the semiconductor wafers; and a conveying mechanism control unit 9 for controlling the conveying mechanism 4 and a system control unit 10 for communicating with and controlling the process stations 5, interface units 6, stocker 7, and conveying mechanism control section 9.

Further, the system additionally comprises an inspection station 8 for inspecting semiconductor wafers processed in the plural, individual process stations 5, and if necessary, a plurality of duplicate process stations 5-11, 5-12, ... for performing the same process, as performed by a specific, individual process station 5.

(2) Construction Permitting Semiconductor Wafers to be Conveyed by Carrier

In the construction (1) described above, the buffer section 12 of the interface unit 6 accommodates a carrier, capable of carrying semiconductor wafers and being mounted in and dismounted (or removed) from the interface unit 6, for conveying the semiconductor wafers, the carrier also being capable of being mounted in the carrier feed-in/feed out section 17 of the stocker 7.

The continuous semiconductor wafer processing system according to the invention has following functions.

(1) One-by-one management of semiconductor wafers
 1) The interface unit 6 has a wafer discrimination section 13 for discriminating individual semiconductor wafers, for one-by-one management of wafers transferred from the conveying mechanism 4 to the process station 5.
 2) The stocker 7 has a wafer discrimination section 16 capable of discriminating individual wafers for one-by-one management of semiconductor wafers transferred from the conveying mechanism 4 to a wafer storage section 15.
 3) The conveying mechanism control unit 9 controls the conveying mechanism 4 according to instructions from the system control unit 10, to convey wafers one by one to given process stations.
 4) The system control section 10 makes decisions on the steps of processing of wafers and control of the conveying and of the progress of processing of wafers by communicating with and controlling the process stations 5, interface units 6, stocker 7, and conveying mechanism control unit 9.

More specifically, the continuous semiconductor wafer processing system according to the invention can process individual wafers one by one in accordance with the process steps, processing procedures, and processing schedules programmed in the system control unit 10.

(2) Flexibility of Process Priority Order among Semiconductor Wafers:

The buffer section 12 of the interface unit 6 temporarily stores semiconductor wafers conveyed thereto by the conveying mechanism 4, and the transfer mechanism 11 transfers wafers to the process station 5 according to a process procedure supplied by the system control unit 10.

More specifically, the continuous semiconductor wafer processing system according to the invention can determine the priority order of the processing of wafers not on the basis of the order in which wafers are conveyed to the interface unit 6, but on the basis of a processing schedule provided by the system control unit 10.

(3) Flexibility of Process Balance among Individual Process Stations:

If there is a deviation from the scheduled timing of the processing performed on each semiconductor substrate in each process station 5, the processes in the individual process stations 5 become unbalanced, so that a repetitive cycle of the reception of wafers at the next process station will be lost.

In such a case, the system control unit 10 temporarily stores predetermined wafers to be conveyed to the next process station in the stocker 7, and thereafer instructs the conveying mechanism 4 and stocker 7 to convey the wafers to the next process station when the next process station becomes ready to receive the wafers.

This means that the continuous semiconductor wafer processing system according to the invention has a flexible repetitive cycle ensuring smooth continuous processing even when a delay occurs in the processing, as a result of the individual process stations 5 operating in an non-synchronous fashion.

(4) Flexibility with Respect to Faults in and Maintenance of Conveying Mechanism:

A carrier for conveying wafers can be mounted in the buffer unit 12 of the interface section 6, and in the carrier feed-in/out section 17 of the stocker 7.

This means that it is possible to convey wafers without using the conveying mechanism 4.

The preferred embodiment will now be described.

(1) System Operation Procedure

A description will now be given of how a series of process operations is actually performed in the continuous semiconductor wafer processing system having the basic construction as described before with reference to FIGS. 2 to 4.

The above continuous semiconductor wafer processing system is capable of setting a first mode of system operation procedure in which wafers are conveyed by the conveying mechanism, and a second mode of system operation procedure in which wafers are conveyed without using the conveying mechanism.

Figure 5A:
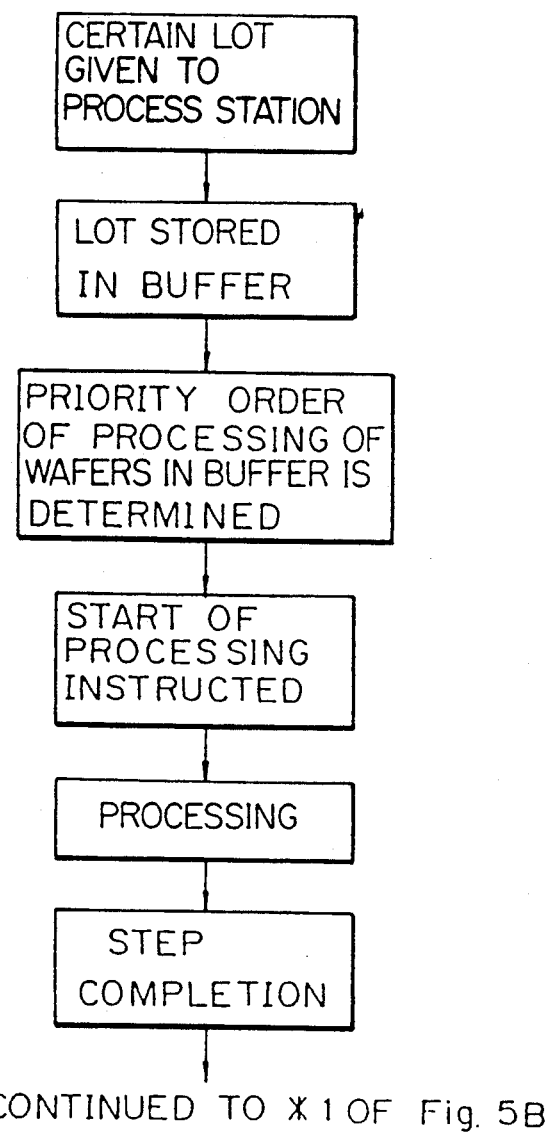
FIGS. 5A to 5D together comprise a flow chart for explaining a first mode of system operation procedure.
Figure 5B:
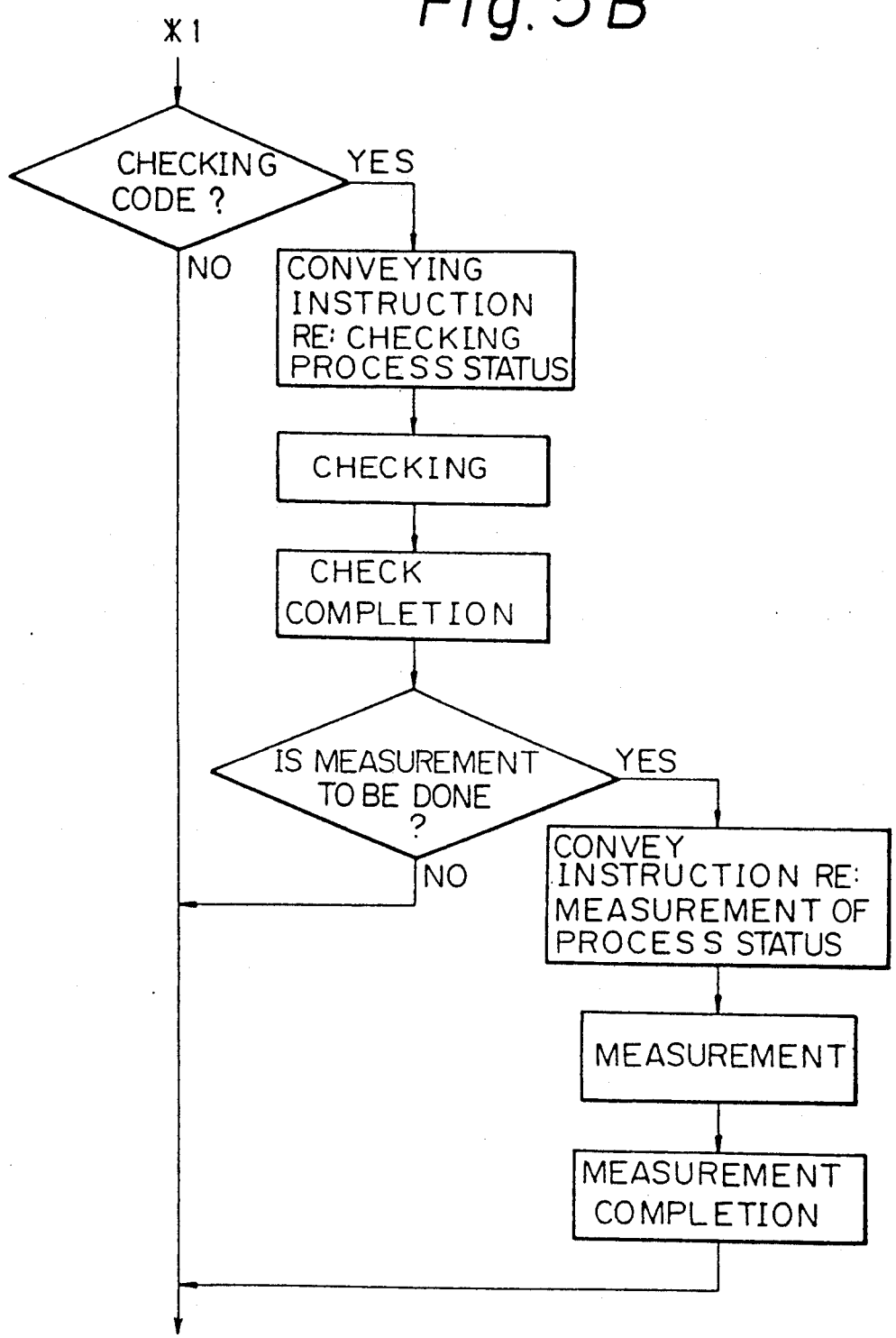
Figure 5C:
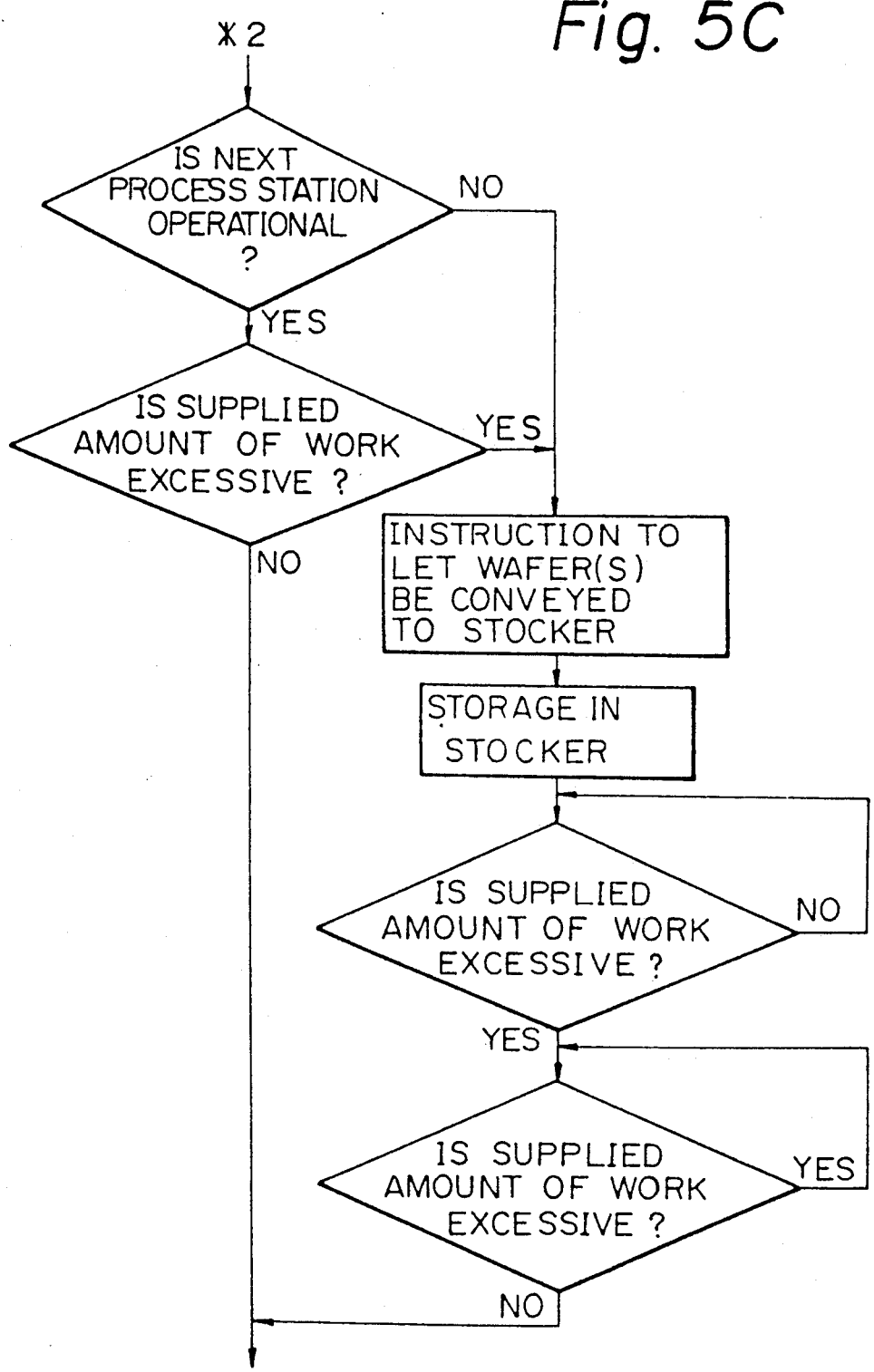
Figure 5D:
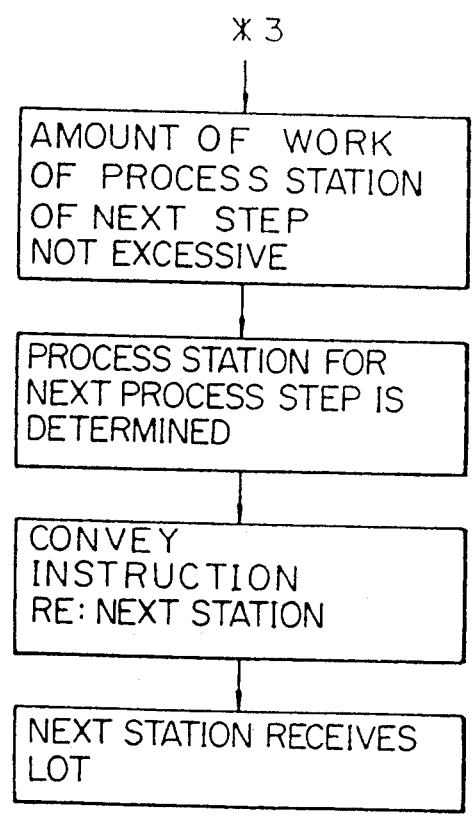

1) First Mode of System Operation Procedure:

FIG. 5A to 5B are flow charts for explaining the first mode of system operation procedure. In this case, operations are performed in the order of the charts of FIGS. 5A to 5D.

The procedure will now be described sequentially.

(1) When receiving a certain lot for processing by a given process station 5, wafers are discriminated one by one by the wafer discrimination section 13 of the associated interface unit 6, for storage in the buffer section 12 thereof.

(2) The interface unit 6 transmits the wafer discrimination results to the system control unit 10, and the system control unit 10 determines the priority order of the processing of the wafers in the buffer section 12 and sends an instruction to start the processing.

(3) The process station 5 processes the wafers as instructed by the system control unit 10.

(4) When checking whether the process (3) is correct, the system control unit 10 sends an instruction to the conveying mechanism control unit 9 to allow each wafer be conveyed to the inspection station 8.

(5) The inspection station 8 carries out a wafer inspection, or checking, step as instructed by the system control unit 10 and if necessary, measures the physical and electric status of each wafer upon completion of each process step.

(6) When the inspection (4) is unnecessary or when the inspection and measurement in (5) are finished, the system control unit 10 instructs the conveying mechanism control unit 9 to allow the wafers to be conveyed to the next process station.

When sending this conveying instruction, the system control unit 10 checks the operating status of the next process station 5, and if it is detected that the operation is suspended or if the amount of work to be performed is excessive, instructs to the conveying mechanism control unit 9 to allow the wafers be conveyed to the stocker 7.

(7) The wafers conveyed to the stocker 7 in (6) are discriminated in the discrimination section 16 and then stored in the storage section 15.

(8) When detecting that the next process station 5 is in operating duty service and that the amount of work supplied thereto is acceptable (i.e., not excessive), the system control section 10 instructs the stocker 7 to allow wafers stored in the stocker (7) to be taken out, discriminated in the discrimination section 16, and transferred to the conveying mechanism 4.

Then, the unit 10 instructs the conveying mechanism control unit 9 to allow the wafers to be conveyed to the next process station.

(9) When plural process stations are provided for the next process step to which the wafers are conveyed in (6) and (8), the system control section 10 compares the amount of work to be performed in the plurality of process stations and allows wafers to be conveyed to a station or stations to which it is determined that wafers can be conveyed.

(10) The next process station 5 receives wafers of the next lot.

Then, the routine returns to the start of the processing to repeat the same sequence of operations until a given processing of the wafers is completed.

Figure 6A:
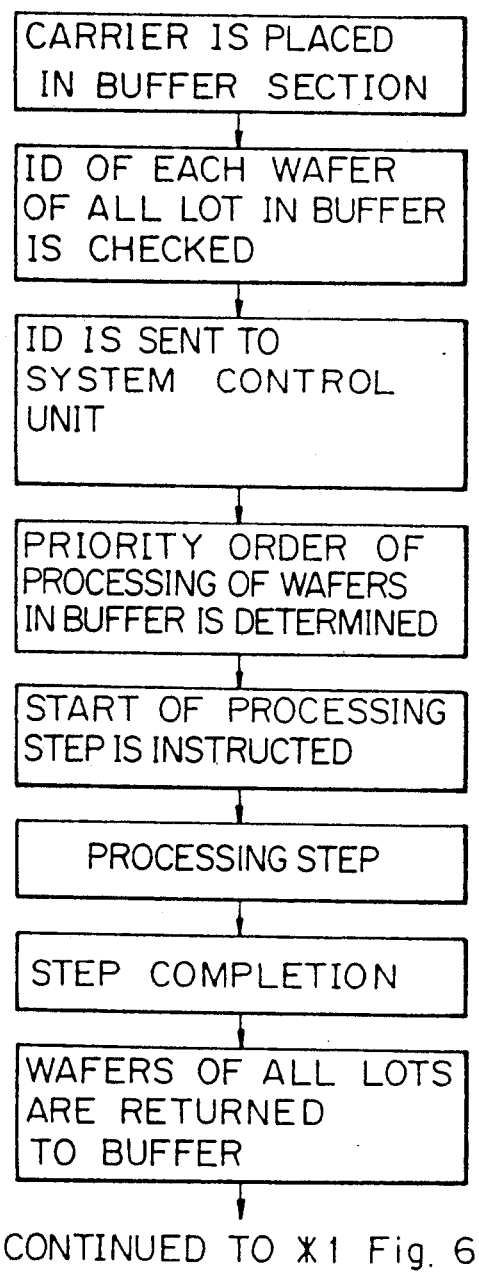
FIGS. 6A and 6B together comprise a flow chart for explaining a second mode of system operation procedure.
Figure 6:
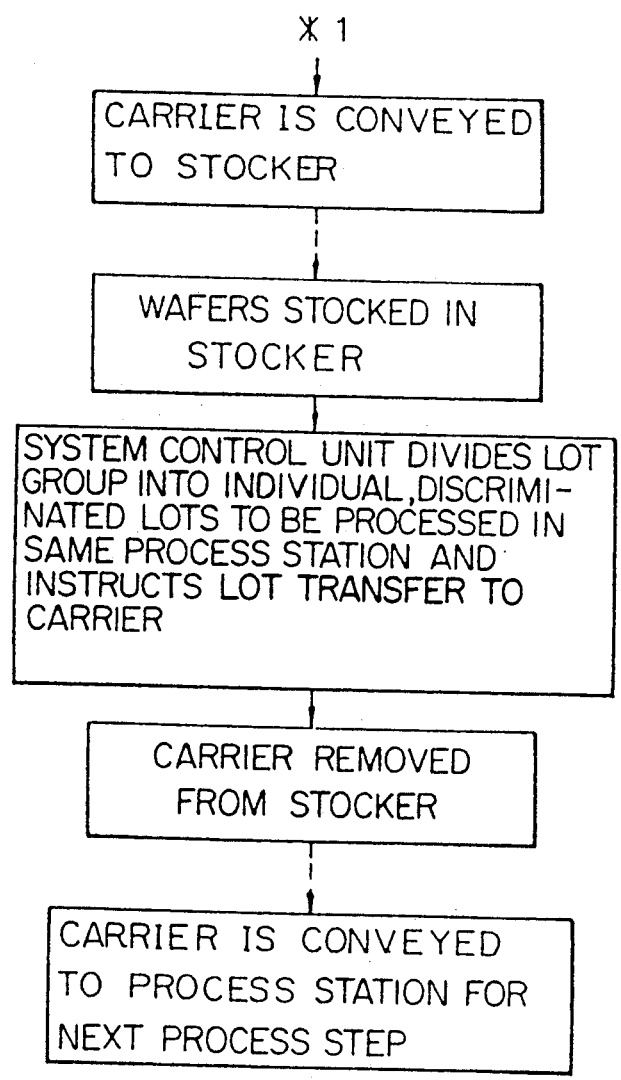

2) Second Mode of Operation Procedure:

FIG. 6A and 6B are flow charts for explaining the second mode of system operation procedure. In this case, operations are performed in the order of the charts of FIGS. 6A and 6B.

The procedure will now be described sequentially.

(1) A carrier carrying a certain lot of wafers is mounted in the buffer section 12 of an interface section 6 pertaining to a given process station 5.

(2) The interface unit 6 discriminates the wafers in the carrier one by one in the discrimination section 13 and then stores them in the buffer section 12.

Then, the unit 6 transmits the wafer discrimination results to the system control unit 10, and the system control unit 10 determines the priority order of the processing of the wafers in the buffer section 12, and sends an instruction to start the processing.

(3) The process station 5 in (1) processes the wafers as instructed by the system control unit 10, and when the processing is completed, stores the wafers in the buffer section 12.

(4) After the processing in (3) of all of the wafers is completed, the carrier is conveyed to the stocker 7 and mounted in the carrier feed-in feed-out section 17 by, for example, the operator.

(5) The stocker 7 discriminates the wafers in the carrier in the discrimination section 16, and then stores the wafers in the storage section 15 while transmitting the wafer discrimination results to the system control unit 10.

(6) The system control unit 10 instructs the stocker 7 to allow only one discriminated lot of wafers, to be processed next in the same process station for the next performance of that process step, to be transferred to the carrier.

(7) The stocker 7 takes out wafers from the storage section 15 for discrimination in the discrimination section 16, and allows only those wafers of the discriminated lot to be processed in the same process station as the next performance of that process step, to be transferred to the carrier in the carrier feed-in/out section 17.

(8) The carrier in (7) is conveyed to the process station 5 as instructed by the system control unit 10 by, for example, the operator.

Then, the routine returns to the start of the processing, thereby to repeat the same sequence of operations until the given processing step of that processing station, for the entire lot group of the wafers is completed.

It is possible to allow the carrier to be conveyed by a robot instead of the operator. Further, the system control unit 10 may instruct the operator to convey the carrier to the next process station, through a display on display means provided on the stocker 7 or interface unit 6.

Figure 7A:
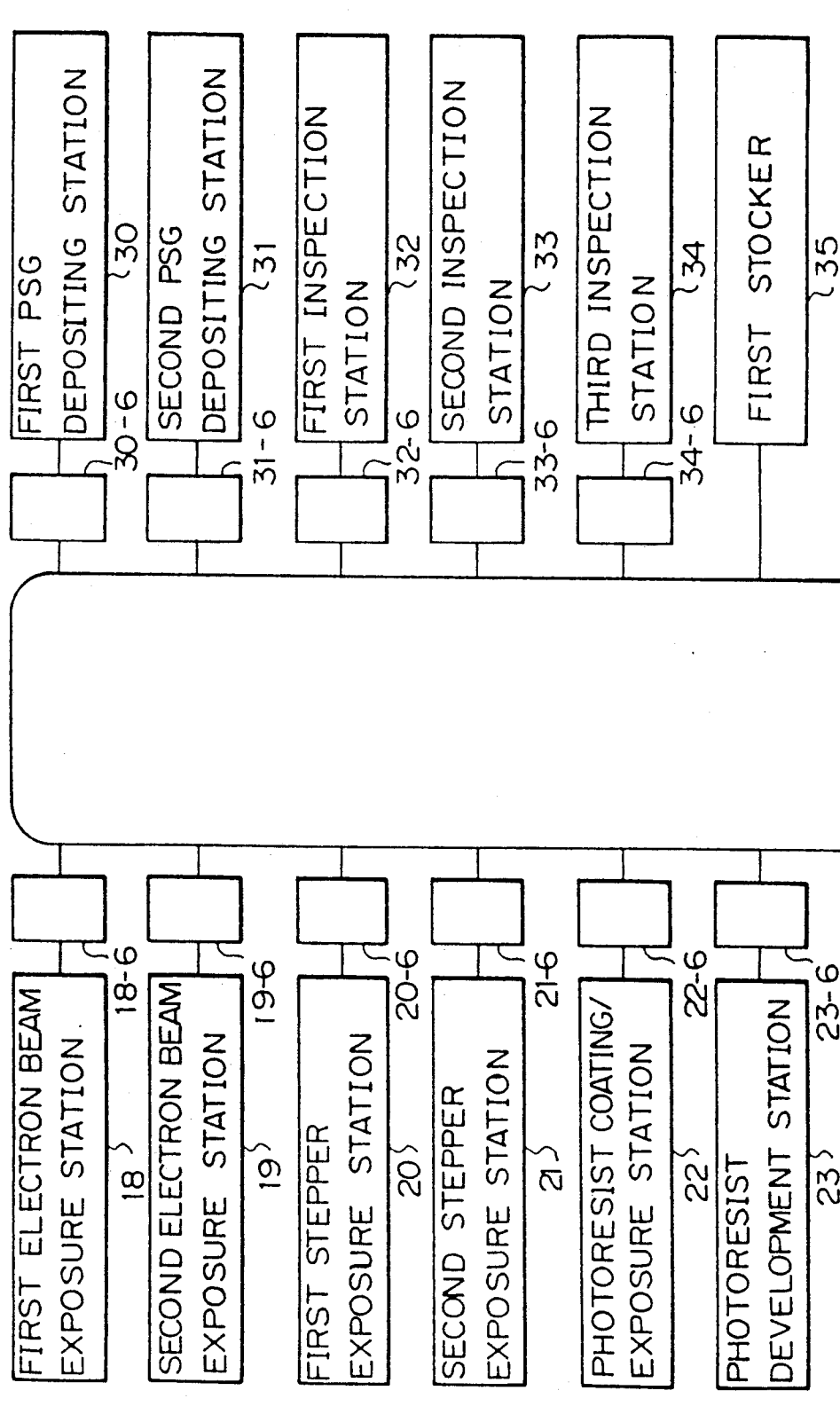
FIGS. 7A and 7B together comprise a block diagram for explaining an embodiment.
Figure 7B:
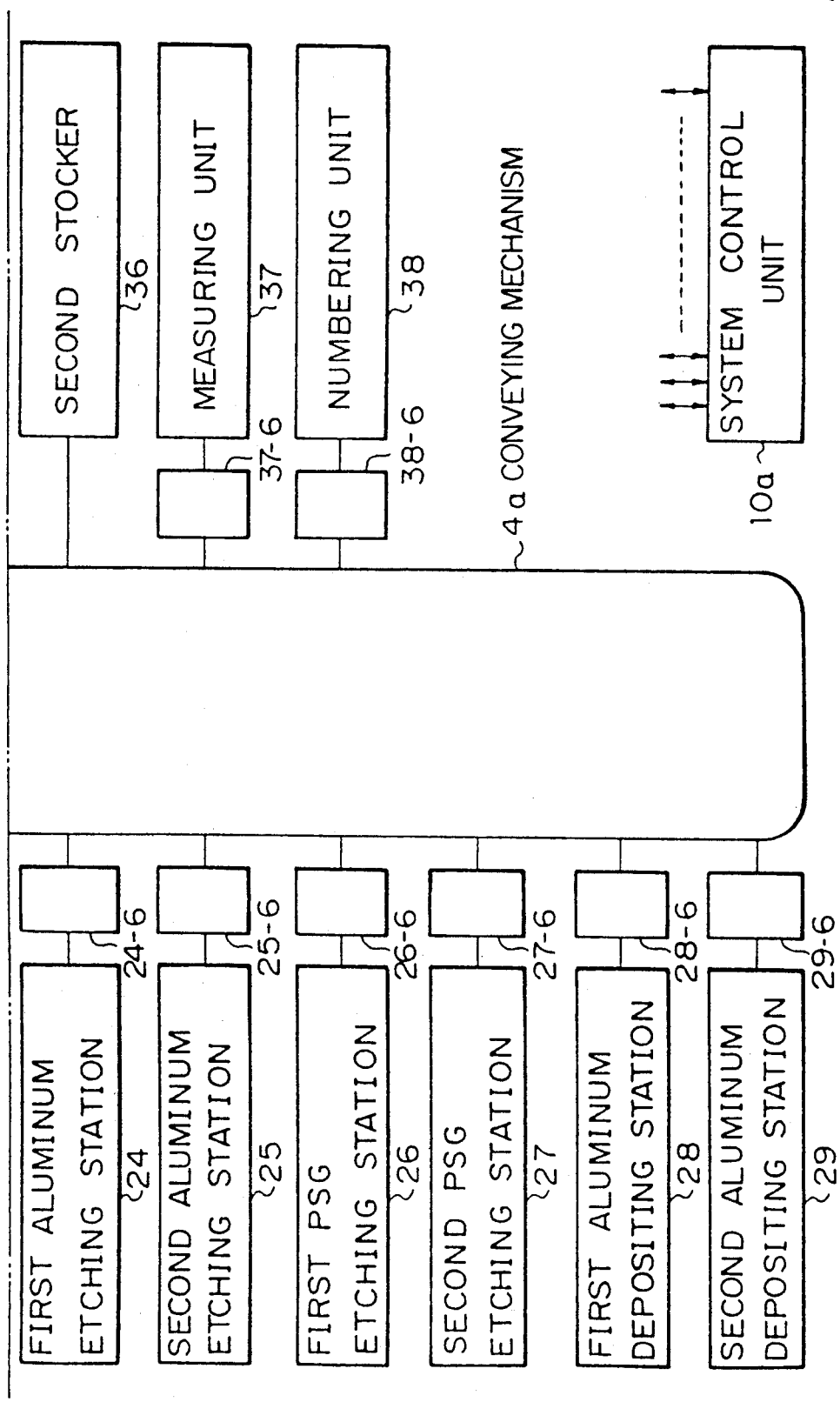

(2) Overall Construction of Continuous Semiconductor Wafer Processing System:

FIGS. 7A and 7B, together, comprise a block diagram for explaining an embodiment of the invention applied to a continuous semiconductor wafer processing system for producing an ASIC with a gate array.

This system comprises two electron beam exposure stations 18 and 19, two stepper exposure stations 20 and 21, one photoresist exposure/coating station 22, one photoresist development station 23, two aluminum etching stations 24 and 25, two PSG (phosphosilicate glass) etching stations 26 and 27, two aluminum deposition stations 28 and 29, two PSG depositing stations 30 and 31, three inspection stations 32, 33 and 34, two stockers 35 and 36, one measuring unit 37, and one numbering unit 38. The individual stations and units 18 to 34 and 37 to 38, and thus excepting the stockers 35 and 36 are coupled to a conveying mechanism via respective interface sections 18-6 to 34-6 and 37-6 to 38-6.

A system control unit 10a on-line communicates with and controls the individual components (i.e., stations, units, interface units and stockers), and contains data regarding the processing steps to be performed on the individual wafers and is aware of the status of the progress of the processing.

In the above construction, it is particularly important that the number of process stations for a given process step need not consist of a plurality of stations. For example, only a single station may be provided for a process step, in which only a short time is necessary for recovery from a fault, while a plurality of process stations may be provided for a process step in which a long time is required for recovery from a fault, such as a process step performed in a vacuum.

This is because, in the event of a fault in one of a plurality of process stations provided for the same process step, the other stations can still carry out the processing step, and thus it is possible to avoid a long-time suspension of that processing step.

(3) Example of Processing of Wafers:

An ASIC with a gate array is manufactured by applying a predetermined wiring pattern to a bulk wafer having a matrix array of basic logic elements.

In this case, the wiring pattern is provided using aluminum, and insulation between adjacent aluminum wiring pattern layers is provided by using PSG.

Figure 8A:
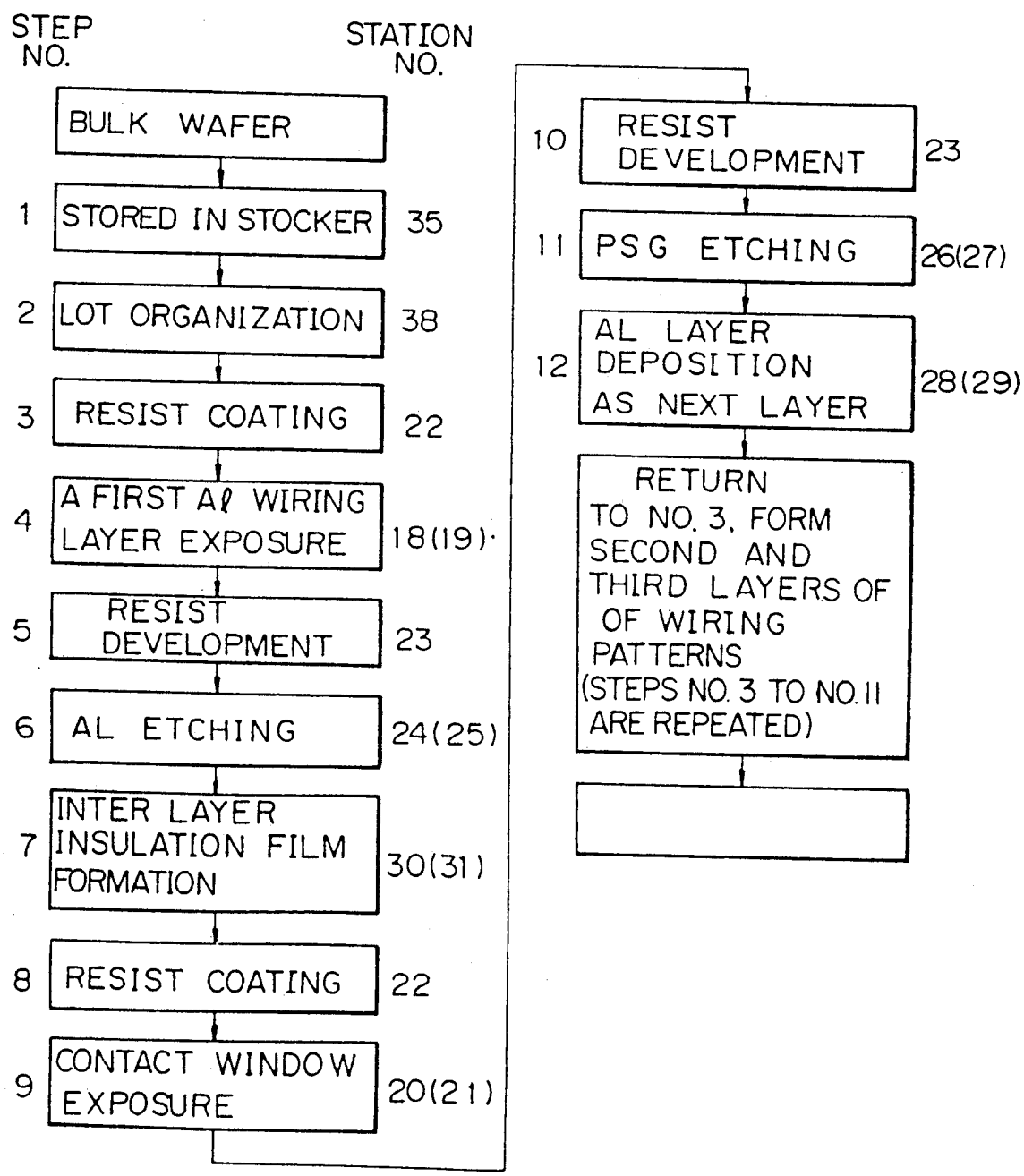
FIGS. 8A and 8B together comprise a flow chart for explaining the processing of a wafer to manufacture an ASIC, with basic operation steps being shown in FIG. 8A and a subroutine between adjacent steps being shown in FIG. 8B.
Figure 8B:
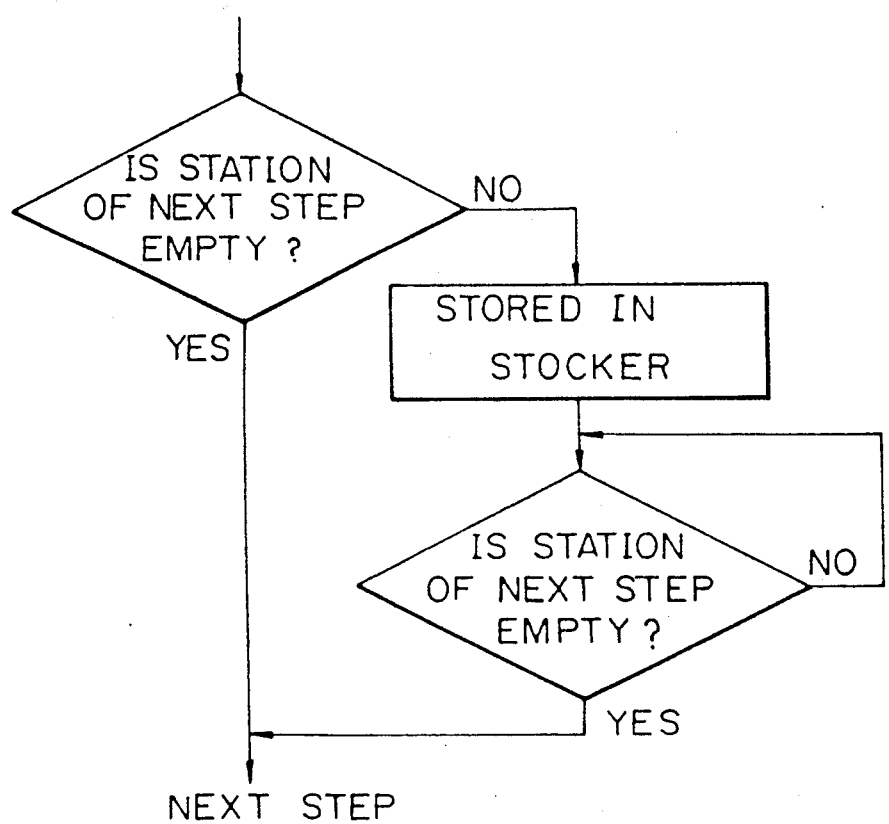

FIGS. 8A and 8B, together, comprise a flow chart for explaining the processing of wafers when manufacturing the ASIC, wherein FIG. 8A is a flow chart for explaining the overall sequence of basic operation steps, and FIG. 8B is a subroutine performed between adjacent, successive process steps performed by corresponding process stations.

The subroutine is provided to temporarily store wafers in the stocker when the next process station is busy.

(1) Step 1

Bulk wafers (semiconductor wafers) after aluminum is deposited are stored in the first stocker 35.

(2) Step 2

The bulk wafers are conveyed to the numbering unit 38, and wafer numbers are applied in the form of bar codes to the bulk wafers to compile a manufacturing lot.

(3) Step 3

A photoresist is coated on the wafers at the photoresist coating station 22.

(4) Step 4

The photoresist of (3) is exposed in accordance with a first aluminum wiring pattern layer at the first or second electron beam exposure station 18 or 19.

(5) The photoresist of (4) is developed at the photoresist development station 23.

(6) Step 6

The first aluminum wiring pattern layer is etched at the first or second aluminum etching station 24 or 25.

(7) Step 7

An inter-layer insulation film is formed at the first or second PSG deposition station 30 or 31.

(8) Step 8

Photoresist again is coated at the photoresist coating section 22.

(9) Step 9

A second aluminum wiring layer pattern on photoresist (8) is exposed at the first or second stepper exposure station 20 or 21, to form contact windows. (10) Step 10

The photoresist of (8) and (9) is developed at the photoresist development station 23.

(11) Step 11

The PSG layer of (7) is etched through the patterned photoresist of (8)–(10) at the first or second PSG etching station 26 or 27.

(12) Step 12

An aluminum layer as a next wiring pattern layer is formed at the first or second aluminum depositing station 28 or 29.

Subsequently, the routine returns to step 3, and accordingly, the second and third layer wiring patterns are formed to complete the prescribed logic ASIC wafers.

In the individual steps, a process station having an adequate (i.e., appropriate, or not excessive) amount of work supplied thereto (i.e., in accordance with the number of wafers supplied thereto for processing) is selected, and the priority order of the processing in the individual process stations is determined by a production schedule programmed in the system control unit 10a.

The same procedure is followed when wafers are conveyed without using the conveying mechanism 4a (for example, when conveyed by an operator or a robot) except that the first or second stocker 33 or 36 is used when the wafers are conveyed by the carrier mechanism 4a.

Figure 9:
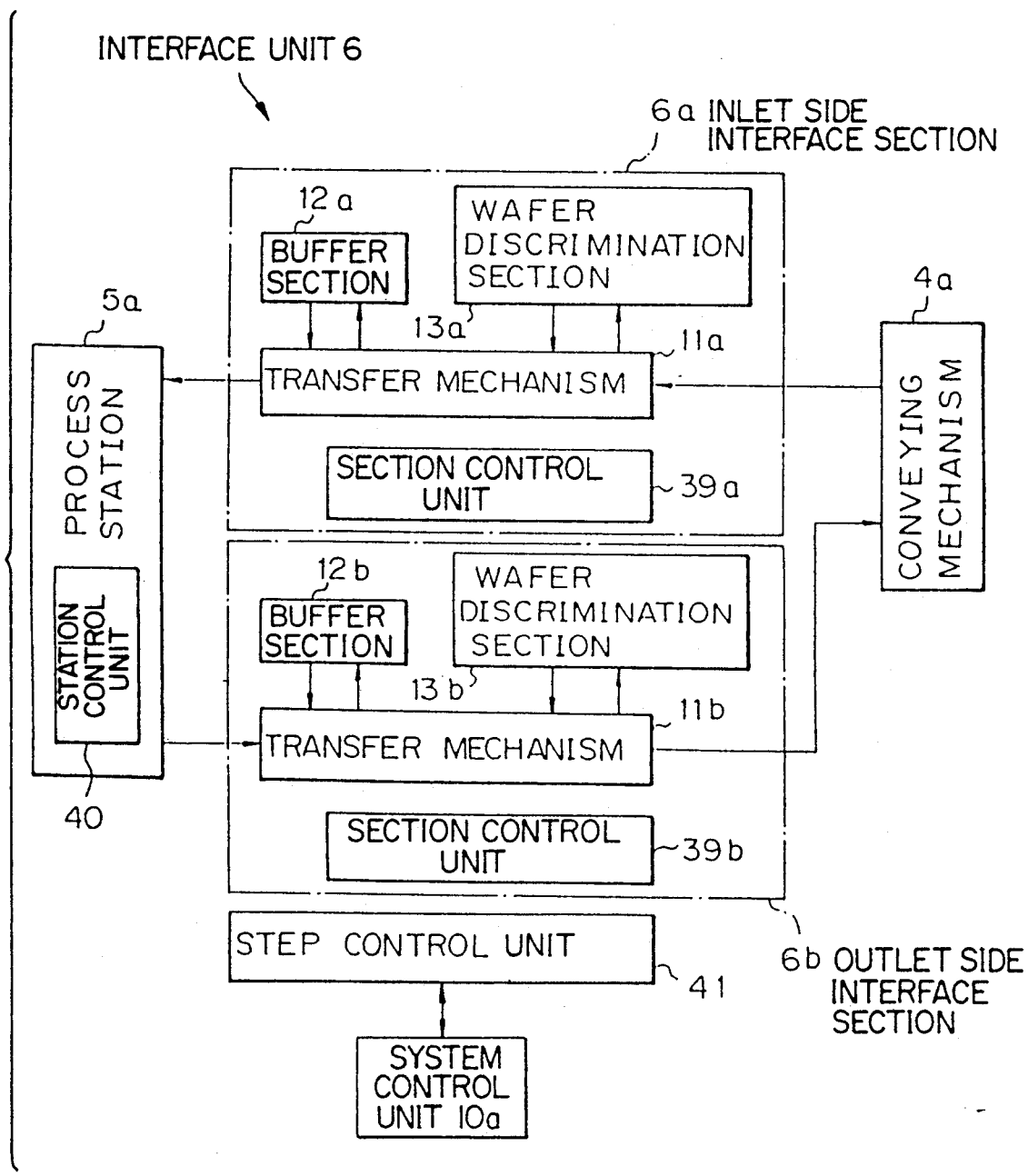
FIG. 9 is a block diagram showing an example of interface section.

(4) Interface Section 6:

FIG. 9 is a block diagram showing an example of an interface unit 6.

In this example, the unit 6 comprises inlet and outlet interface sections 6a and 6b provided on the respective inlet and outlet sides of each process station 5a. The individual interface sections 6a and 6b respectively include buffer sections 12a and 12b, wafer discrimination sections 13a and 13b, and transfer mechanisms 11a and 11b, and further include respective section control units 39a and 39b for controlling the operation thereof.

The process station 5a includes a station control unit 40 for controlling the processing performed thereby.

A step control unit 41 collectively controls the section control units 39a and 39b to provide a working synchronization of the interface sections 6a and 6b and process station 5a.

Figure 10A:
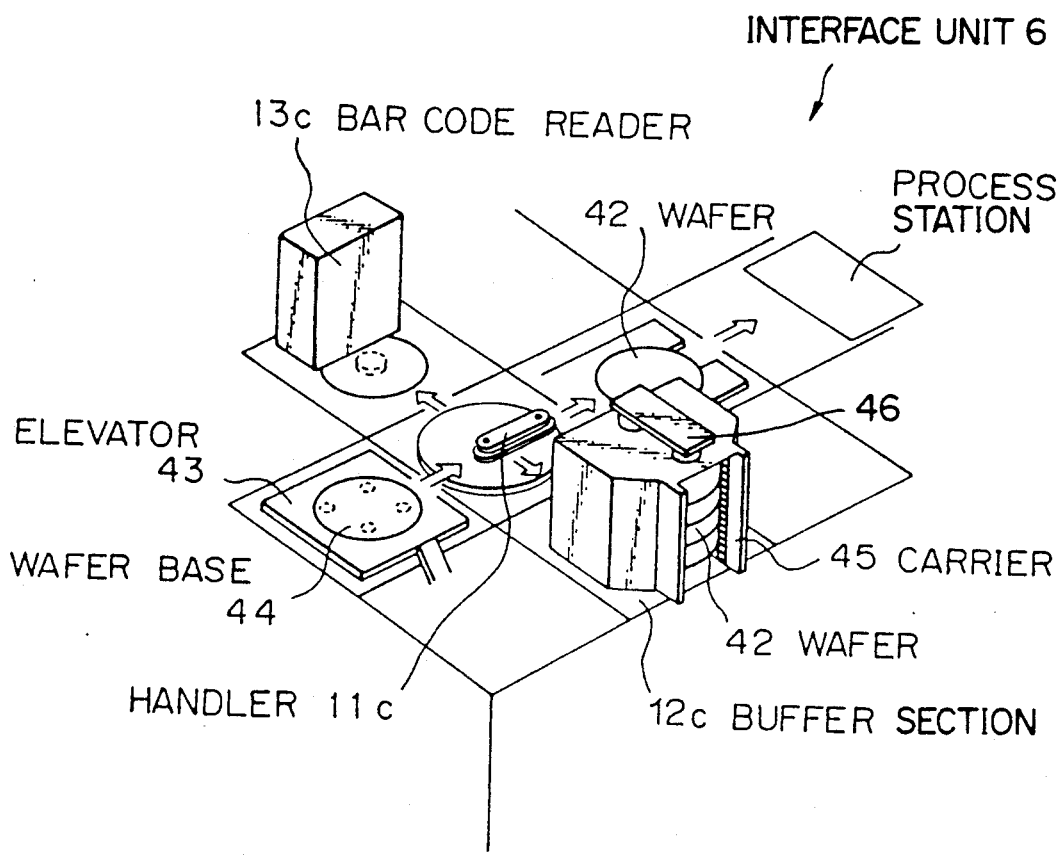
FIG. 10A is a perspective view of the interface section and FIG. 10B is a perspective view of a carrier.
Figure 10B:
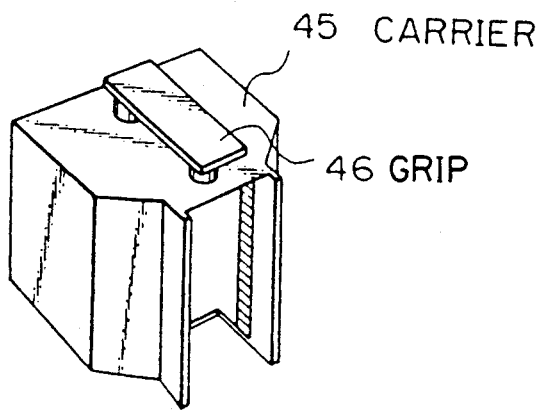

The control units 39a, 39b, 40 and 41 communicate with and are controlled by the system control unit 10a shown in FIG. 7B. FIGS. 10A and 10B show the actual construction of the interface unit 6 of FIG. 9, wherein FIG. 10A is a perspective view of the interface unit 6, and FIG. 10B is a perspective view of a carrier 45.

This example of the interface unit 6 includes a handler 11c for transferring wafers 42, a bar code reader 13c for discriminating the wafers 42, and a carrier 45 accommodated in buffer section 12c for temporarily storing the wafers 42. An elevator 43 is provided for conveying the wafers 42 vertically where the conveying mechanism and interface unit 6 have different installation heights.

The carrier 45 can be mounted in and dismounted from the buffer 12c, and has a grip 46 so that it can be readily conveyed by an operator.

(5) Stocker 7

Figure 11:
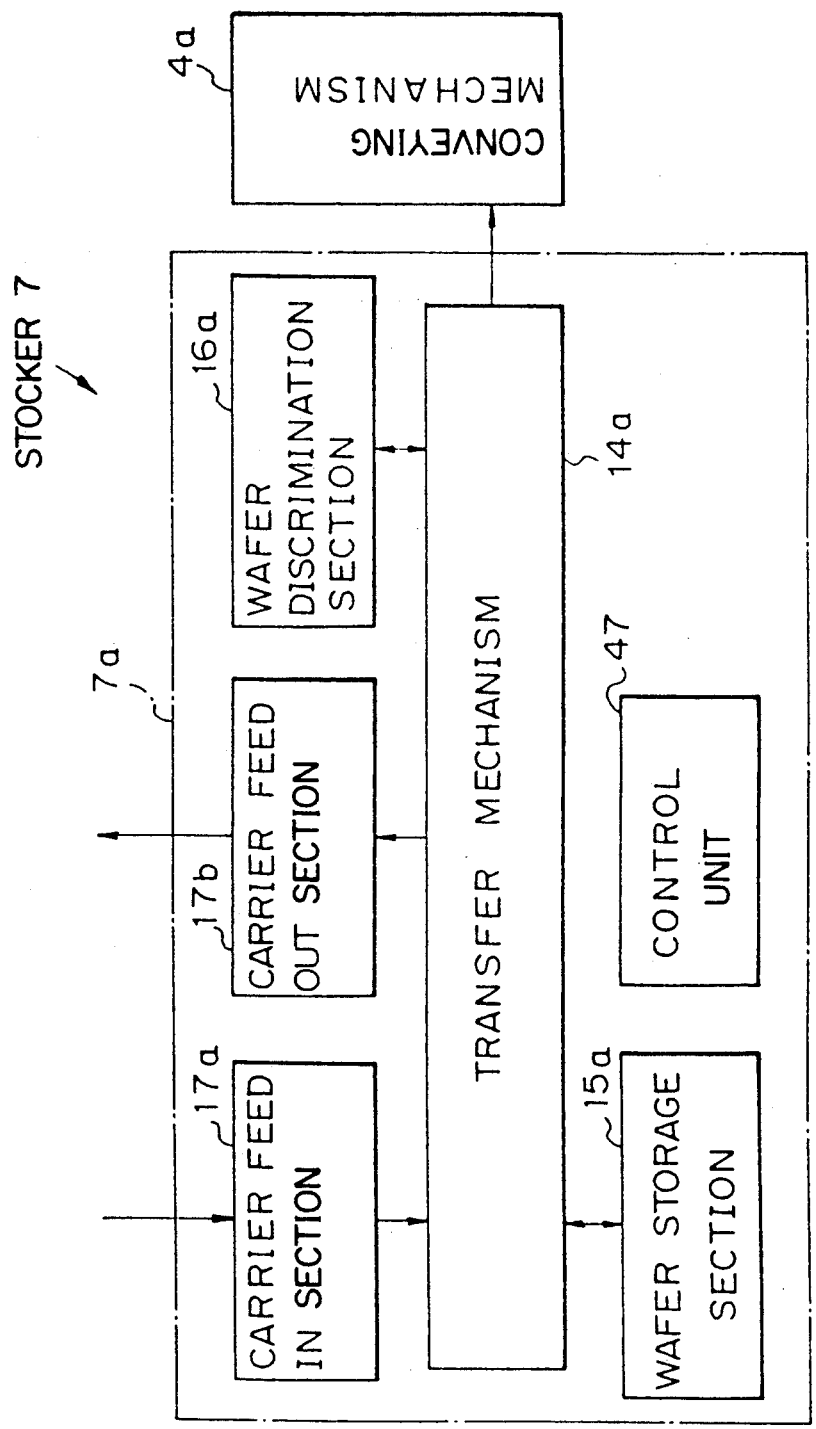
FIG. 11 is a block diagram for explaining an example of stocker.

FIG. 11 is a block diagram showing an example of the stocker 7 of FIG. 2, as a stocker 7a.

The stocker 7a has independent carrier feed-in and feed-out sections 17a and 17b, and includes a storage section 15a, a discrimination section 16a, and a transfer mechanism 14a, and further, a control unit 47 for controlling the operation thereof.

The control unit 47 communicates with and is controlled by the system control unit 10a shown in FIG. 7B.

Figure 12:
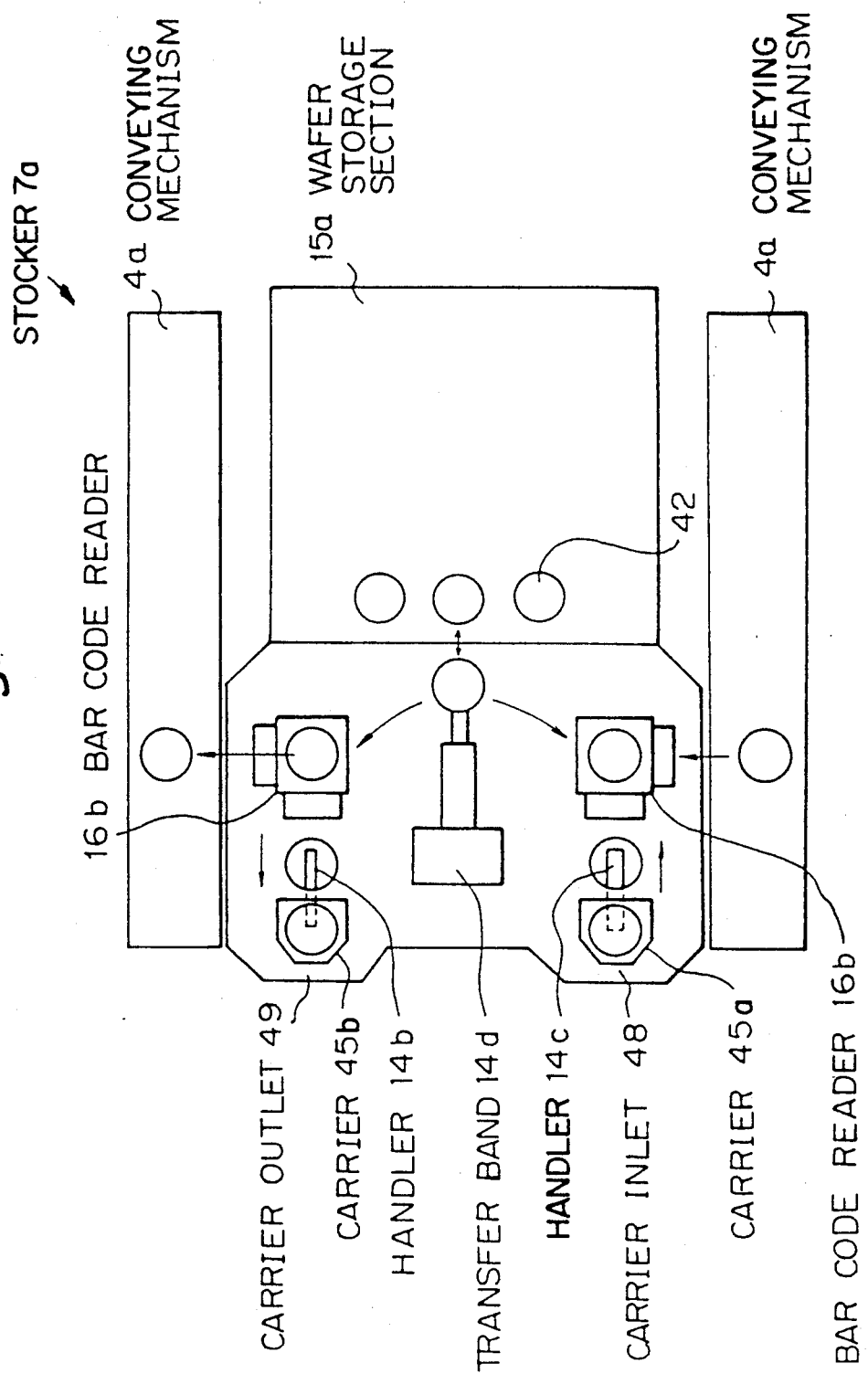
FIG. 12 is a plan view showing an actual construction of stocker.

FIG. 12 is a plan view showing an actual construction of a stocker 7a.

This example of a stocker 7a includes a transfer band 14d for transferring wafers 42, a wafer storage section 15a for storing wafers 42, a bar code reader 16b for discriminating wafers, a carrier inlet 48 for receiving a feed carrier 45a therein, a carrier outlet 49 for receiving a storage carrier 45b therefrom, a handler 14c for taking wafers 42 out of the carrier 45a, and a handler 14b for storing wafers in the carrier 45b.

The bar code reader 16b is provided at a position past that at which wafers 42 can be moved from the conveying mechanism 4a and from the carrier 45a, so that bar codes can be read out from wafers 42 bath as transferred from the conveying mechanism 4a and those transferred from the carrier 45.

Figure 13:
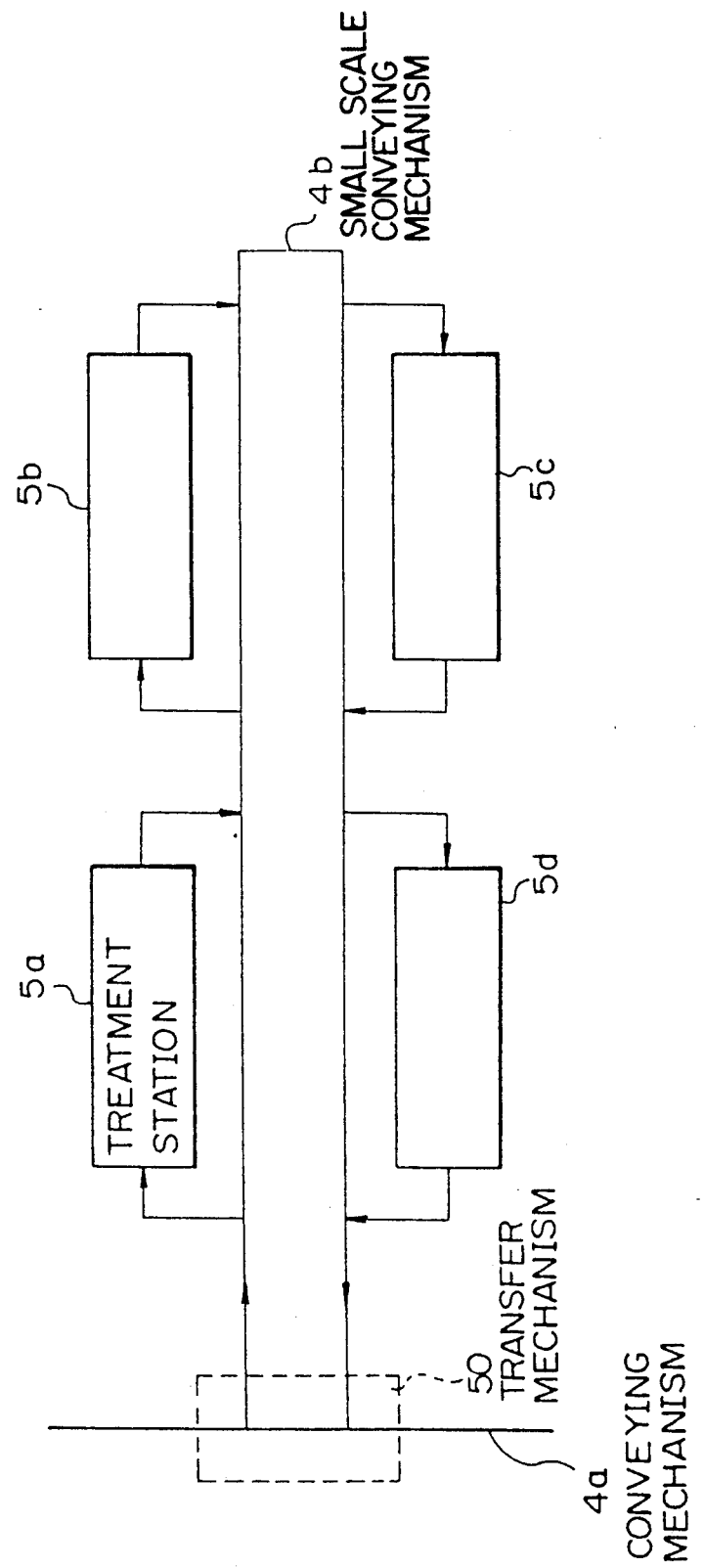
FIG. 13 is a block diagram for explaining a small scale conveying mechanism extending along associated process stations.

(6) Small-scale conveying Mechanism:

FIG. 13 is a block diagram for explaining a small-scale conveying mechanism 46 together with various process stations 5a to 5d.

Often the space utilization factor of a plant is lowered when all of the process stations are coupled to a central conveying mechanism.

In such a case, it is better to supplement the central conveying mechanism 4a with a small-scale conveying mechanism 4b, to which the process stations 5a to 5d are directly coupled.

It is necessary, however, to provide a wafer transfer mechanism 50 between the central conveying mechanism 4a and the small-scale conveying mechanism 4b.

Figure 14:
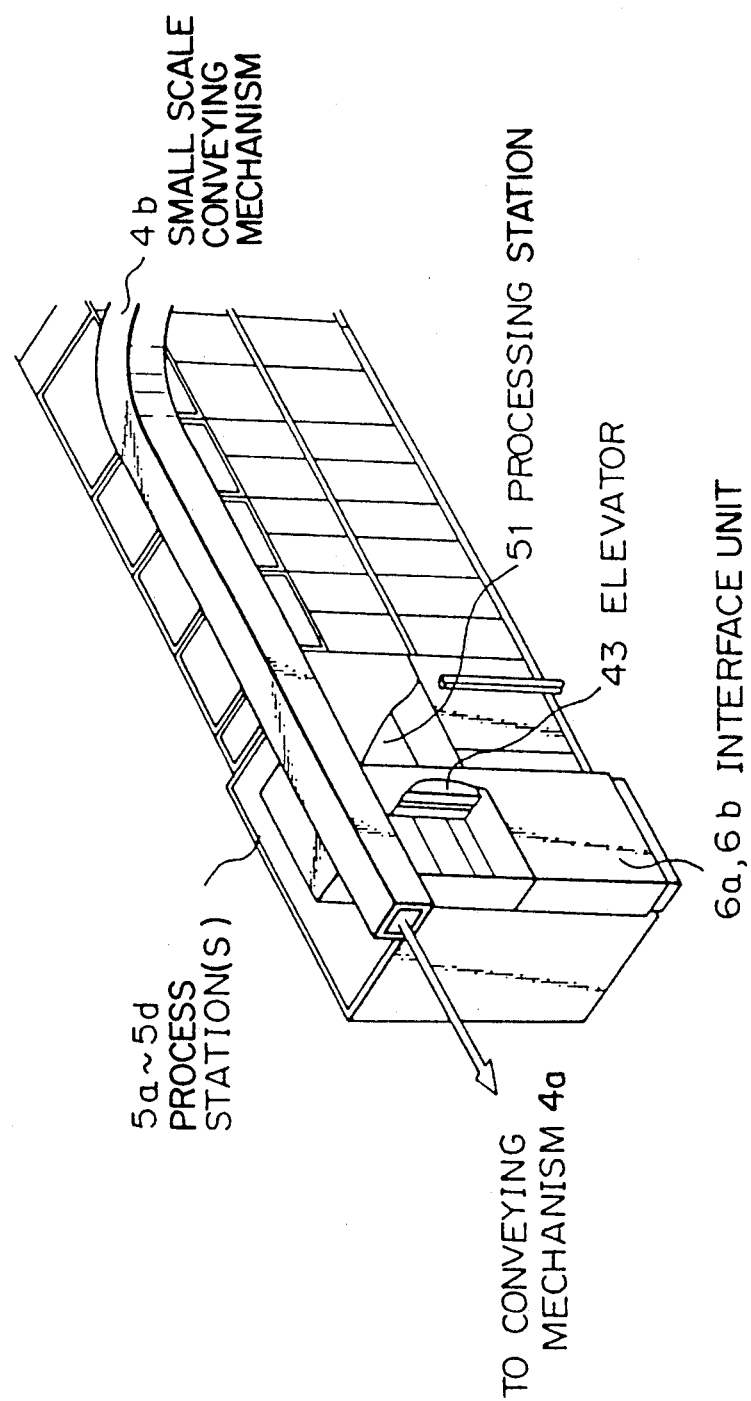
FIG. 14 is a perspective view for explaining the way in which each process station is coupled to the conveying mechanism.

FIG. 14 is a perspective view showing a way in which a process station 5a (to 5d) is coupled to the small-scale conveying mechanism 46.

The small-scale conveying mechanism 4b extends above individual process stations 5a to 5d, and interface units 6a and 6b and an elevator 43 are provided for the transfer of wafers between each of the process stations 5a to 5d and the small-scale conveying mechanism 4b.

Wafers are then conveyed to process station 51.

The continuous semiconductor wafer processing system as described above according to the invention has the following features.

(1) One-by-one management of semiconductor wafers is possible.

(2) An interface section is provided between each process station and the conveying mechanism, and the interface section can set the priority order of the temporary storage of wafers and the processing of the stored wafers.

(3) When a next process station to which wafers are to be conveyed is not operative or is holding an excessive quantity of work, wafers to be supplied are temporarily stored in a stocker until the start of a resumption of processing or until the quantity of work held in the process station is reduced to an extent such that it can receive wafers.

(4) Where a plurality of identical process stations are provided for the next process step to which wafers are to be conveyed, wafers are conveyed to the one of these stations holding the least quantity of work.

(5) On-line control by the system control unit is possible even when a fault occurs in or during maintenance of the conveying mechanism, and it is possible to permit operation of the processing system by conveying wafers not with the conveying mechanism but on a carrier-by-carrier basis.

The continuous semiconductor wafer processing system according to the invention thus has the following effects.

(1) The operation of the processing system is possible even when a fault occurs in, or during maintenance of, the conveying mechanism, so that it is possible to minimize any delay of the production schedule.

(2) It is possible to give priority to the processing of wafers which will otherwise cause delay in the production schedule. Thus, it is possible to meet a delivery term of a plurality of lots of semiconductor wafers simultaneously, at a high level.

(3) A plurality of different kinds of wafers can be processed concurrently, and their delivery terms can be met simultaneously and at a high level even if their processing timings are different.

As shown above, it is possible to realize a continuous semiconductor wafer processing system which is very flexible with respect to the continuous processing of a plurality of different lots or different kinds of wafers, and has a high productivity.

We claim:

1. A continuous semiconductor wafer processing system for continuously performing a plurality of process steps, in accordance with one or more predetermined sequences of such process steps, on one or more lots of semiconductor wafers, comprising:

a wafer conveying mechanism;

plural carriers and means for moving each carrier independently of the conveying mechanism, each carrier having a capacity of receiving up to a predetermined number of semiconductor wafers to be conveyed thereby and being configured for automated transfer of semiconductor wafers to and from the carrier;

plural process stations for performing plural, successive process steps on semiconductor wafers to be processed by the processing system, each process station performing a respective, predetermined one of the process steps;

plural interface units respectively associated with said plural process stations, each interface unit coupling the respectively associated process station to the conveying mechanism and comprising a wafer discrimination section for discriminating semiconductor wafers, a buffer section for temporarily storing discriminated semiconductor wafers and adapted for mounting a carrier therein and being operable for selectively transferring semiconductor wafers to and from the carrier, and a transfer mechanism, the transfer mechanism of each interface unit coupling the conveying mechanism and the respectively associated process station and being selectively operable for transferring semiconductor wafers therebetween, the transfer mechanism being coupled to each of the buffer and wafer discrimination sections and being selectively and jointly operable with each thereof for transferring wafers to and from the buffer section and to and from the wafer discrimination section;

a stocker coupled to said conveying mechanism and selectively and jointly operable therewith for transferring semiconductor wafers therebetween, the stocker temporarily storing the semiconductor wafers, as transferred thereto, during time intervals intermediate the performance of successive processing steps thereon, the stocker comprising a wafer discrimination section for discriminating semiconductor wafers, a carrier feed-in/feed-out section adapted for mounting of a carrier therein and selectively operable for transfer of semiconductor wafers therebetween, a wafer storage section, and a transfer mechanism, the transfer mechanism being coupled to the conveying mechanism and being selectively operable therewith for transferring semiconductor wafers therebetween, and being coupled to each of the wafer storage section, the wafer discrimination section and the carrier feed-in/feed-out section and selectively and jointly operable with each said section for transfer of semiconductor wafers therebetween;

conveying mechanism control means for controlling the conveying mechanism, selectively, to convey semiconductor wafers to and from each of the respectively associated process stations and interface units and to and from the stocker; and system control means, operable in accordance with a predetermined processing program which defines said one or more predetermined sequences of process steps to be performed on corresponding, discriminated lots of semiconductor wafers, for communicating with and thereby monitoring and controlling each of the interface units and respectively associated process stations, the stocker, and the conveying mechanism control means, selectively for each discriminated lot of semiconductor wafers and in accordance with the next process step of the sequence to be performed thereon, the system control means selecting the corresponding process station for performance of that next process step on each such discriminated lot and controlling the conveying of each such lot to the corresponding, selected process station, the transferring of each such lot by the transfer mechanism of the respectively associated interface unit to the selected process station for performance of the process step thereon and, upon completion of the performance of the process step, the transferring of each such lot from the process station and the further conveying thereof, alternatively, to a next selected process station or to the stocker for transfer thereto and temporary storage therein, and the transferring of each such lot from the stocker and the subsequent conveying thereof to a next process station, said system control means selectively controlling said conveying mechanism to effect said conveying and, alternatively, issuing instructions for moving each said carrier and thereby conveying the semiconductor wafers received therein, from and to successive, next selected process stations and said stocker, for all said lots of semiconductor wafers and in accordance with a priority order of processing of same as defined by the predetermined processing program.

2. A continuous semiconductor wafer processing system according to claim 1, further comprising:

an inspection station coupled to said conveying mechanism and selectively operable therewith, in response to said system control means, for transferring semiconductor wafers therebetween and for inspecting discriminated semiconductor wafers transferred thereto and received thereby, relative to the process steps theretofore performed thereon and in accordance with a pre-programmed inspection sequence of the predetermined processing program.

3. A continuous semiconductor wafer processing system according to claim 2, wherein said system control means controls each interface unit individually and selectively and following the completion of each process step by the associated process station, for transferring the discriminated semiconductor wafers on which the associated process step is completed from the respective process station and to the conveying mechanism, controls the conveying mechanism control means for selectively conveying same by said conveying mechanism to the inspection station, and selectively and jointly controls said conveying mechanism and said inspection station for transfer of the thus-conveyed and discriminated semiconductor wafers from the conveying mechanism and to the inspection station for inspection thereby.

4. A continuous semiconductor wafer processing system according to claim 1, wherein:

said system control means, in response to a determination that a next process station to which a given, discriminated lot semiconductor wafers is to be conveyed is holding work in excess of a permissible amount, controls the conveying mechanism control means for selectively conveying said given lot by the conveying mechanism to the stocker and selectively and jointly controls said conveying mechanism and said stocker for transfer of the given lot to the stocker, the stocker discriminating the thus transferred, given lot in the wafer discrimination section thereof and storing the thus-discriminated, given lot in the wafer storage section thereof;

said system control means monitoring the status of the process stations and, in response to determining the availability of a next process station for performing the required next process step on a given lot of discriminated semiconductor wafers temporarily stored in said wafer storage section of said stocker and in accordance with a preprogrammed sequence of the predetermined processing program, controlling the stocker for sequentially removing the semiconductor wafers of the given, discriminated lot thereof from the wafer storage thereof and discriminating the thus-removed wafers and selectively and jointly controlling said stocker and said conveying mechanism for transfer of the sequentially removed and discriminated wafers from the stocker to the conveying mechanism for conveying thereby to said available, next process station.

5. A continuous semiconductor wafer processing system according to claim 4, wherein:

said system control means, in response to communications with the associated interface section of each said process station and in accordance with a priority ordering program of said predetermined processing program, controls the priority order of processing of individual semiconductor wafers in each said process station sequentially and with respect to and in accordance with the semiconductor wafers as discriminated in said discrimination section of said interface unit and the storage of the thus sequentially discriminated semiconductor wafers in said buffer section of said associated interface unit.

6. A continuous semiconductor wafer processing system according to claim 1, wherein:

said system control means, in response to determining a monitored, inoperable status of the conveying mechanism and in accordance with a carrier-conveying program sequence of said predetermined processing program, controls each of said process stations and respectively associated interface units and said stocker in accordance with, and issues instructions directing, the moving of said carriers by said moving means, independently of the conveying mechanism, for conveying semiconductor wafers to and from each interface unit and to and from said stocker thereby to maintain continuous processing of semiconductor wafers by said system.

7. A continuous semiconductor wafer processing system according to claim 6, wherein:

said system control means, for controlling transfer of semiconductor wafers between a carrier and said stocker, issues an instruction for mounting of a carrier in the feed-in/feed-out section of said stocker and, in response to monitoring of the presence of a carrier so mounted, selectively controls the transfer of the semiconductor wafers from the carrier to said stocker and the temporary storage by said stocker of the thus transferred semiconductor wafers in the wafer storage section thereof and the selective removal of temporarily stored semiconductor wafers from the wafer storage section thereof and transfer of the thus removed semiconductor wafers to the carrier.

8. A continuous semiconductor wafer processing system according to claim 7, wherein:

said system control means, in response to a determination that a next process station to which a given, discriminated lot semiconductor wafers is to be conveyed is holding work in excess of a permissible amount, issues an instruction for selectively conveying said given lot by a carrier to the stocker and selectively and jointly controls said carrier and said stocker for transfer of the given lot from the carrier to the stocker, the stocker discriminating the thus transferred, given lot in the wafer discrimination section thereof and storing the thus-discriminated, given lot in the wafer storage section thereof;

said system control means monitoring the status of the process stations and, in response to determining the availability of a next process station for performing the required next process step on a given lot of discriminated semiconductor wafers temporarily stored in said wafer storage section of said stocker and in accordance with a preprogrammed sequence of the predetermined processing program, controlling the stocker for sequentially removing the semiconductor wafers of the given, discriminated lot thereof from the wafer storage section thereof, discriminating the thus, sequentially removed wafers, and transferring the sequentially removed and discriminated wafers from the stocker to the carrier and, further, issuing an instruction for conveying the carrier with the wafers therein to said available, next process station.

9. A continuous semiconductor wafer processing system according to claim 7, wherein:

said system control means, in accordance with monitoring a carrier positioned at the feed-in/feed-out section of the stocker, selectively controls the transfer mechanism of the stocker to transfer semiconductor wafers from said carrier, as mounted in said feed-in/feed-out section, to said discrimination section for discrimination thereby and then from said discrimination section to said storage section thereof for temporary storage therein and, further, controls said stocker and the units thereof for transfer of only the semiconductor wafers to be conveyed to said next process station and respectively associated interface unit, said system control unit controlling said transfer mechanism of said stocker, for transferring only those semiconductor wafers to be conveyed to said next process station from said storage section thereof and to said wafer discrimination section thereof for individual discrimination therein, and from said discrimination section thereof to said carrier feed-in/feed-out section thereof for transfer to and receipt in said carrier mounted in said carrier feed-in/feed-out section.

10. A continuous semiconductor wafer processing system according to claim 6, wherein:

said system control unit, in response to and in accordance with the mounting of a carrier having semiconductor wafers received therein and conveyed thereby to the buffer section of a process station, controlling said interface unit and the priority order of processing of the individual semiconductor wafers in the respectively associated process station, in accordance with controlling the transfer mechanism of the associated interface unit for transferring the semiconductor wafers from the carrier and to the wafer discrimination section thereof for discriminating the thus transferred semiconductor wafers and for selectively transferring the thus discriminated semiconductor wafers from the wafer discrimination section to said buffer section thereof and, further, controlling the transfer of the discriminated semiconductor wafers from said buffer section. and to said associated processing station for sequential processing thereby.

11. A continuous semiconductor wafer processing system according to claim 1, wherein:

said plural process stations include a group of identical process stations, each thereof performing a given, identical process step; and said system control unit monitors the respective buffer sections of the respectively associated interface units of said identical process stations of said group thereof and performs a determination of which of said monitored buffered sections has the greatest available capacity for receiving further semiconductor wafers therein and, in accordance with said determination, controls said conveying mechanism for conveying a lot of semiconductor wafers, on which the next process step to be performed thereon is said given, identical process step, to the interface unit for which the buffer section has the thus-determined, greatest available capacity.

* * * * *

UNITED STATES PATENT AND TRADEMARK OFFICE
CERTIFICATE OF CORRECTION

PATENT NO. : 5,024,570
DATED : June 18, 1991
INVENTOR(S) : KIRISEKO ET AL

It is certified that error appears in the above-indentified patent and that said Letters Patent is hereby corrected as shown below:

| | |
|---|---|
| Col. 1, | line 28, after "Processing" insert --System--; |
| | line 62, before "FET" insert --a--. |
| Col. 2, | line 55, change "IA" to --1A--. |
| Col. 4, | line 58, change "feed-in feed-out" to --feed-in/feed-out--. |
| Col. 6, | line 13, change "unit 12" to --section 12--, and change "section 6" to --unit 6--; |
| | line 31, change "FIG." to --FIGS.--; |
| | line 51, after "wafer" insert --to--. |
| Col. 7, | line 7, change "section 10" to --unit 10--; |
| | line 27, change "FIG." to --FIGS.--; |
| | line 50, change "feed-in feed-out" to --feed-in/feed-out--. |
| Col. 9, | line 29, after "windows" make "(10) Step 10" a new paragraph. |

UNITED STATES PATENT AND TRADEMARK OFFICE
CERTIFICATE OF CORRECTION

PATENT NO. : 5,024,570
DATED : June 18, 1991
INVENTOR(S) : KIRISEKO ET AL

It is certified that error appears in the above-indentified patent and that said Letters Patent is hereby corrected as shown below:

Col. 10, line 41, delete "therefrom";
line 47, change "bath" to --both--;
line 52, change "46" to --4b--;
line 66, change "46" to --4b--.

Col. 13, line 52, change "wafers" to --wafer--.

Col. 14, line 65, after "lot" insert --of--.

Col. 16, line 23, delete ".".

Signed and Sealed this

Thirteenth Day of July, 1993

Attest:

MICHAEL K. KIRK

Attesting Officer      Acting Commissioner of Patents and Trademarks